United States Patent [19]
van Hattum et al.

[11] 4,202,013
[45] * May 6, 1980

[54] LINE TIME BASE IN TELEVISION RECEIVER

[75] Inventors: Johannes S. A. van Hattum; Jan A. C. Korver, both of Eindhoven, Netherlands

[73] Assignee: U.S. Philips Corporation, New York, N.Y.

[*] Notice: The portion of the term of this patent subsequent to Oct. 9, 1990, has been disclaimed.

[21] Appl. No.: 400,403

[22] Filed: Sep. 24, 1973

Related U.S. Application Data

[63] Continuation of Ser. No. 229,081, Feb. 24, 1972, Pat. No. 3,764,744.

[30] Foreign Application Priority Data

Mar. 16, 1971 [NL] Netherlands .......................... 7103466

[51] Int. Cl.² .............................................. H04N 5/04
[52] U.S. Cl. .................................... 358/158; 315/411
[58] Field of Search ................................ 358/159, 158

[56] References Cited

U.S. PATENT DOCUMENTS 2,137,798  11/1938  Bowman-Manifold et al. .... 358/158

*Primary Examiner*—Robert L. Griffin
*Assistant Examiner*—Joseph A. Orsino, Jr.
*Attorney, Agent, or Firm*—Thomas A. Briody; William J. Streeter; Edward W. Goodman

[57] ABSTRACT

A line time base in a television receiver including a symmetrical limiter for cutting off the line flyback pulses from which the reference signal for the synchronizing circuit is derived. As a result a slice is obtained whose duration and amplitude is constant and independent of the load on the EHT generator.

5 Claims, 5 Drawing Figures

LINE TIME BASE IN TELEVISION RECEIVER

This is a continuation, of application Ser. No. 229,081, filed Feb. 24, 1972 now U.S. Pat. No. 3,764,744.

The invention relates to a line time base in a television receiver comprising a television display tube, a line deflection coil for writing lines on the screen of the tube, an EHT generator for generating an EHT by means of rectifying line flyback pulses for the final anode of the television display tube, said line time base including a line synchronizing circuit in which a reference signal derived from the line flyback pulses is compared in frequency and/or phase with the received line synchronizing pulses.

A sawtooth voltage is generally used as a reference signal which voltage is the result of the integration of the line flyback pulses produced in the line output stage. These pulses may, however, vary in shape and height, for example, as a result of a variation of the load on the EHT generator, that is to say, of the luminosity on the screen of the television display tube. In such a case these pulses are not reliable and the lines written on the screen would be shifted relative to each other dependent on the variation in luminosity and hence on the picture content. As a result, for example, vertical straight lines would be displayed crooked.

An object of the invention is to provide a reliable reference signal and to this end the line time base according to the invention is characterized in that in order to prevent shifts as a function of the load on the EHT generator of the lines written on the screen the line time base is provided with a symmetrical limiter for cutting off the line flyback pulses from which the reference signal is derived.

In order that the invention may be readily carried into effect, some embodiments thereof will now be described in detail, by way of example with reference to the accompanying diagrammatic drawings in which.

Figure 1A:
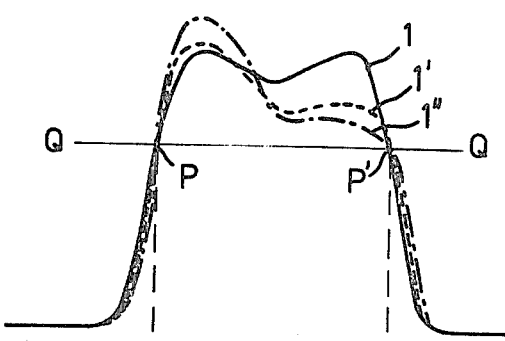
FIG. 1a shows a line flyback pulse.

FIG. 1a shows a line flyback pulse 1 which is produced in the line output stage of a television receiver when the EHT generator coupled to this line output stage is not loaded. When the EHT generator is loaded the peak amplitude of pulse 1 slightly decreases and the pulse may be distorted and/or the base of the pulse may widen. This is especially the case in colour television receivers in which, as is known, the beam current may be fairly high. Pulse 1 is therefore unsuitable for generating the reference voltage for the synchronizing circuit.

However, it has been found by experiment that when the line time base is satisfactorily synchronized with the line synchronizing pulses received from the transmitter, the line flyback pulses have a different shape in case of a loaded EHT generator than in case of an unloaded EHT generator, but the time interval during which the pulses exceed one given value is constant and substantially independent of the load. FIG. 1a shows three waveforms in which 1 represents a flyback pulse in the unloaded condition while 1' and 1" show the same pulse for different loads. It is found that curves 1, 1' and 1" intersect at substantially the same points P and P' which are located on one and the same horizontal line Q—Q. The height of line Q—Q depends on the circuit arrangement used. It is evident from FIG. 1a that the time interval between points P and P' is substantially constant. The invention is based on the recognition of using this fact in order to obtain a reliable reference signal for the synchronizing circuit.

Figure 1B:
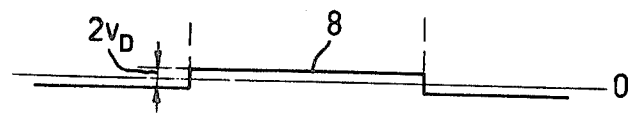
FIG. 1b shows the result of the limitation thereof
Figure 2:
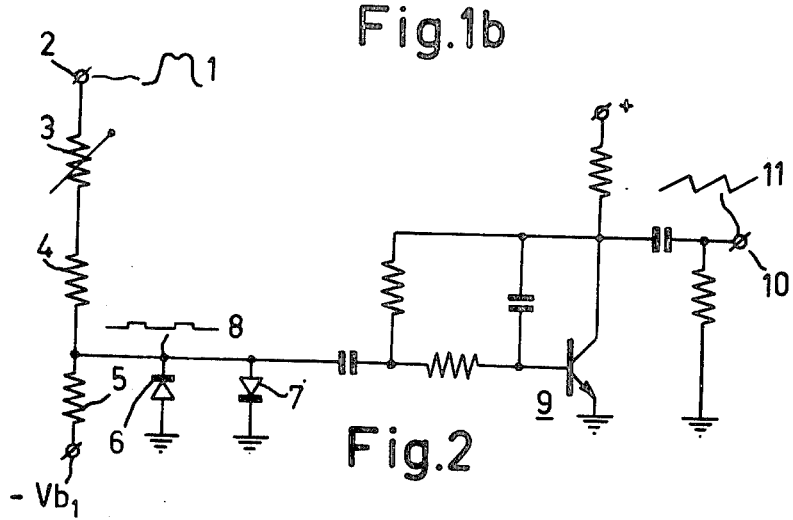
FIG. 2 shows an embodiment of the line time base according to the invention.

One possible embodiment of this principle is diagrammatically shown in FIG. 2. An adjustable resistor 3 and two fixed resistors 4 and 5 are arranged in series between a point 2 of a line transformer (not shown) at which positively directed line flyback pulses 1 are present and a direct voltage source $-V_{b1}$ which is negative relative to earth. A symmetrical limiter formed with two diodes 6 and 7 is arranged between the junction of resistors 4 and 5 and earth while the anode of diode 6 and the cathode of diode 7 is connected to earth. A square-wave voltage 8 having a peak-to-peak amplitude of $2v_D$ is produced at the said junction in which $v_D$ is the threshold voltage of a diode (approximately 0.7 V for silicon diodes). The level at which the flyback pulses are cut off with the aid of the symmetrical limiter at the level which corresponds to points P and P' in FIG. 1a can be adjusted with the aid of variable resistor 3 and the choice of voltage $-V_{b1}$. The voltage 8 shown in FIG. 1b has positively directed pulses whose duration and amplitude are substantially constant. A condition therefor is that the amplitude of the flyback pulse which would be produced at the said junction in the absence of the two diodes is high relative to voltage $2v_D$, which imposes conditions on the proportioning of resistors 3, 4 and 5. Voltage 8 drives, via a capacitor, a Miller integrator 9 whose output 10 conveys the sawtooth voltage 11 which may be applied as a reference signal to a synchronizing circuit not shown, because it has an amplitude and a flyback period which are always constant, hence independent of the picture content.

Figure 3A:
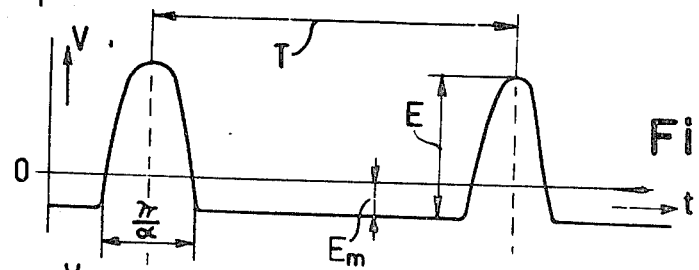
FIGS. 3a and 3b shows idealized line flyback pulses.

The circuit of FIG. 2 may be proportioned as follows. FIG. 3a shows line flyback pulses as sinusoidal pulses which, as is known, is a rough approximation If E is the peak-to-peak amplitude the mean value thereof is $$E_m = \frac{2E}{T} \int_0^{\frac{\pi}{2\alpha}} \cos\alpha\, t\, dt = \frac{2E}{\alpha T},$$

in which $2\pi/\alpha$ is the period of the sine function and T is the line period. If $\omega$ is the angular line frequency, $T=2\pi/\omega$ so that $E_m=\omega E/\pi\alpha$.

Figure 3B:
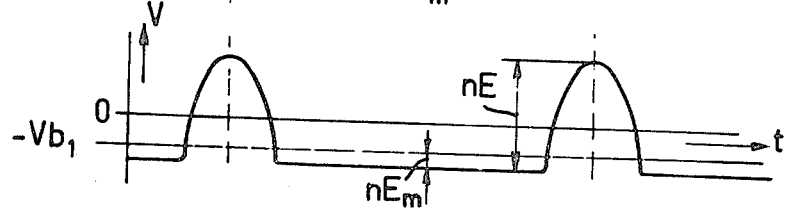

Since the line flyback period takes 15 to 18% of line period T, $\pi/\alpha\cdot 1/T=\omega/2\alpha\approx 1/6$ and $E_m\approx E/3\pi\approx 0.1$ E. When the pulses are derived from one end 2 of a winding whose other end is connected to earth, the voltage at end 2 assumes the value $-E_m$ during the scan period as is shown in FIG. 3a. In the absence of symmetrical limiter 6, 7 a voltage (FIG. 3b) would be produced at the junction of resistors 4 and 5 which is uniform with that of FIG. 3a but multiplied by the factor of $\eta=R_5+/R_3+R_4+R_5$ in which $R_3$, $R_4$ and $R_5$ are the values of resistors 3, 4 and 5, respectively. During the scan period the voltage at the said junction would assume the value $-V_{b1}-nE_m\approx -V_{b1}-n0.1E$. The diodes 6 and 7 then cut off a a thin space around the voltage zero. It is evident from FIG. 3b that the zero level is located at a level which is $nE_m+V_{b1}$ higher than the level occurring during the scan period. Voltage $-V_{b1}$ and resistor 3 may be chosen to be such that the zero level coincides with that of line Q—Q of FIG. 1a.

Since voltage 8 is applied through a capacitor to integrator 9, the anode of diode 6 and the cathode of diode 7 may be connected to a positive voltage while voltage source $\cdot V_{b1}$ may be replaced by earth.

Actually, the pulses of FIG. 3 are not sinusoidal, but a similar method as the one described above may be used.

What is claimed is:

1. A circuit for producing from a television line flyback signal a stable reference signal regardless of the load upon the line signal source, said circuit comprising input means for receiving a line flyback signal; means direct current coupled to said input means for amplitude limiting said flyback signal to a first voltage if said flyback signal is above said first voltage; means direct current coupled to said input means for amplitude limiting said flyback signal to a second voltage if said flyback signal is below said second voltage and an output means coupled to limiting means for supplying a reference signal in accordance with said limited flyback signals.

2. A circuit as claimed in claim 1 wherein said input means comprises a first resistor adapted to receive said flyback pulses, and a second resistor coupled to said first resistor and a first potential; said limiting means each comprises a diode, said diodes having opposite type electrodes parallel coupled together and to ground and to the junction of said resistors respectively, said junction having a second potential higher than said first potential.

3. A circuit as claimed in claim 2 wherein said input means further comprises a variable third resistor series coupled to said first resistor.

4. A circuit as claimed in claim 1 wherein said input means further comprises means for adjusting the magnitude of said input signal, applied to said limiting means.

5. A circuit as claimed in claim 1 wherein said output means comprises an integrator circuit.

* * * * *